(12) United States Patent
Speraw

(10) Patent No.: US 6,313,997 B1
(45) Date of Patent: Nov. 6, 2001

(54) BUMP-CONFIGURED, PERFORATED-PLATE ARCHITECTURE FOR HOUSING PRINTED CIRCUIT BOARDS WITHOUT EMI LEAKS

(75) Inventor: Floyd G. Speraw, Anderson, SC (US)

(73) Assignee: Pliant Systems, Inc., Research Triangle Park, NC (US)

(*) Notice: Subject to any disclaimer, the term of this patent is extended or adjusted under 35 U.S.C. 154(b) by 0 days.

(21) Appl. No.: 09/248,245

(22) Filed: Feb. 10, 1999

(51) Int. Cl.[7] ........................................ H05K 1/14
(52) U.S. Cl. .................. 361/741; 361/740; 361/752; 361/756; 361/759; 361/800; 361/802; 361/818
(58) Field of Search .................... 361/741, 756, 361/802, 740, 747, 759, 801, 724–727, 732, 796, 797, 752; 439/61, 64, 69, 377; 211/41.17, 26, 50

(56) References Cited

U.S. PATENT DOCUMENTS 4,519,016 * 5/1985 Bradley et al. ..................... 361/741
5,019,948 * 5/1991 Steketee et al. ..................... 361/741

* cited by examiner

Primary Examiner—Jeffrey Gaffin
Assistant Examiner—Phuong T. Vu
(74) Attorney, Agent, or Firm—Allen, Dyer Doppelt Milbrath & Gilchrist, P.A.

(57) ABSTRACT

A printed circuit board card cage contains upper and lower perforated sheet metal plates, having a plurality of mutually opposed staggered patterns of bumps, that are configured to form guide channels for guiding printed circuit boards into engagement with respective card slot backplane connectors, thereby eliminating the need for attachment of a separate set of card guides. The patterns of card guide bumps or 'upsets' are arranged so as to direct, yet constrain, the travel paths of printed circuit boards from their points of insertion through grooves in rails at the front of the chassis to the backplane connectors, while providing minimal interruption of a gridwork of cooling air flow perforations through the sheet metal plates. The upsets themselves do not penetrate the sheet metal plates, and the size of the perforations are such that there are no EMI leaks, thus eliminating the need for and assembly of additional perforated plates. The staggered pattern of upsets is the same for each card slot, so that a single punch tool can be configured to be engaged in a processor controlled press, with the pitch between bumps programmably variable.

12 Claims, 2 Drawing Sheets

BUMP-CONFIGURED, PERFORATED-PLATE ARCHITECTURE FOR HOUSING PRINTED CIRCUIT BOARDS WITHOUT EMI LEAKS

FIELD OF THE INVENTION

The present invention relates in general to communication systems, and is particularly directed to a printed circuit card housing architecture having upper and lower perforated card metallic guide panels, that contain staggered arrangements of bumps distributed among a matrix of air flow perforations in the panels, the bumps forming card installation channels for guiding printed circuit boards into engagement with backplane connectors therefor, while providing minimal interruption of cooling air flow perforations, without EMI leaks.

BACKGROUND OF THE INVENTION

Telecommunication equipment installations customarily employ electronic hardware racks, respective shelves of which have backplane connectors into which printed circuit boards are inserted. For this purpose, a typical housing architecture may contain mutually aligned sets of elongated U-shaped card guides that are affixed to upper and lower frames of the shelf. These card guides are sized to receive and guide upper and lower edges of printed circuit boards into physical and electrical engagement with backplane connectors, that are vertically installed in a side-by-side arrangement at a backplane of the shelf. The front edge of each printed circuit board is usually terminated by a face plate, having a latch that engages the shelf frame, when the printed circuit board is fully inserted into its slot, so that the front plates of multilayer printed circuit board forms a front panel closure for the shelf.

With such a compact and nested arrangement these are two operational issues that must be addressed: providing sufficient air flow over the printed circuit boards for cooling; and constraining electromagnetic interference (EMI). To constrain EMI emissions, the shelf is customarily surrounded by conductive (metallic) shielding plates, two of which serve as upper and lower mounting supports for the mutually aligned sets of card guides. In order to provide air flow to the printed circuit boards, a plurality (e.g. matrix) of holes or perforations may be formed in each mounting plate.

Unfortunately, this configuration suffers from several drawbacks. First, in order to support the card guides, the perforated mounting plates must have sufficient thickness for rigidity and strength. Secondly, because of the presence of the card guides, relatively large air flow apertures must be formed in the mounting plates between the card insertion channels in order to afford adequate air flow to the cards. However, since large air flow apertures undesirably provide a path for EMI emissions, it is necessary to install additional perforated EMI shielding plates adjacent to the card guide mounting plates. Such additional shielding plates undesirably increase hardware volume, complexity and cost, especially since a different tooling set is required for each type of shelf arrangement.

SUMMARY OF THE INVENTION

In accordance with the present invention, the shortcomings of conventional printed circuit board housing architectures described above are effectively obviated by a new and improved shelf structure having upper and lower perforated guide panels, or sheet metal plates, that contain mutually opposed staggered arrangements or patterns of bumps or 'upsets'. As will be described these mutually opposed bump arrangements form guide channels for guiding printed circuit boards into engagement with respective card slot backplane connectors, thereby eliminating the need for attachment of a separate set of card guides.

The patterns of card guide upsets are arranged so as to direct, yet constrain, the travel paths of printed circuit boards from their points of insertion through grooves in rails at the front of the chassis to the backplane connectors, while providing minimal interruption of a matrix or gridwork of air flow perforations through the sheet metal plates. The upsets themselves do not penetrate the sheet metal plates, so that there are no EMI leaks, thus eliminating the need for and assembly of additional perforated plates. The staggered pattern of upsets is the same for each card slot, so that a single punch tool can be configured to be engaged in a numerically controlled (NC) press, with the pitch between bumps programmably variable, thereby providing a much less costly tool, that is applicable to a variety of shelf shapes and sizes.

DETAILED DESCRIPTION OF THE INVENTION

Figure 1:
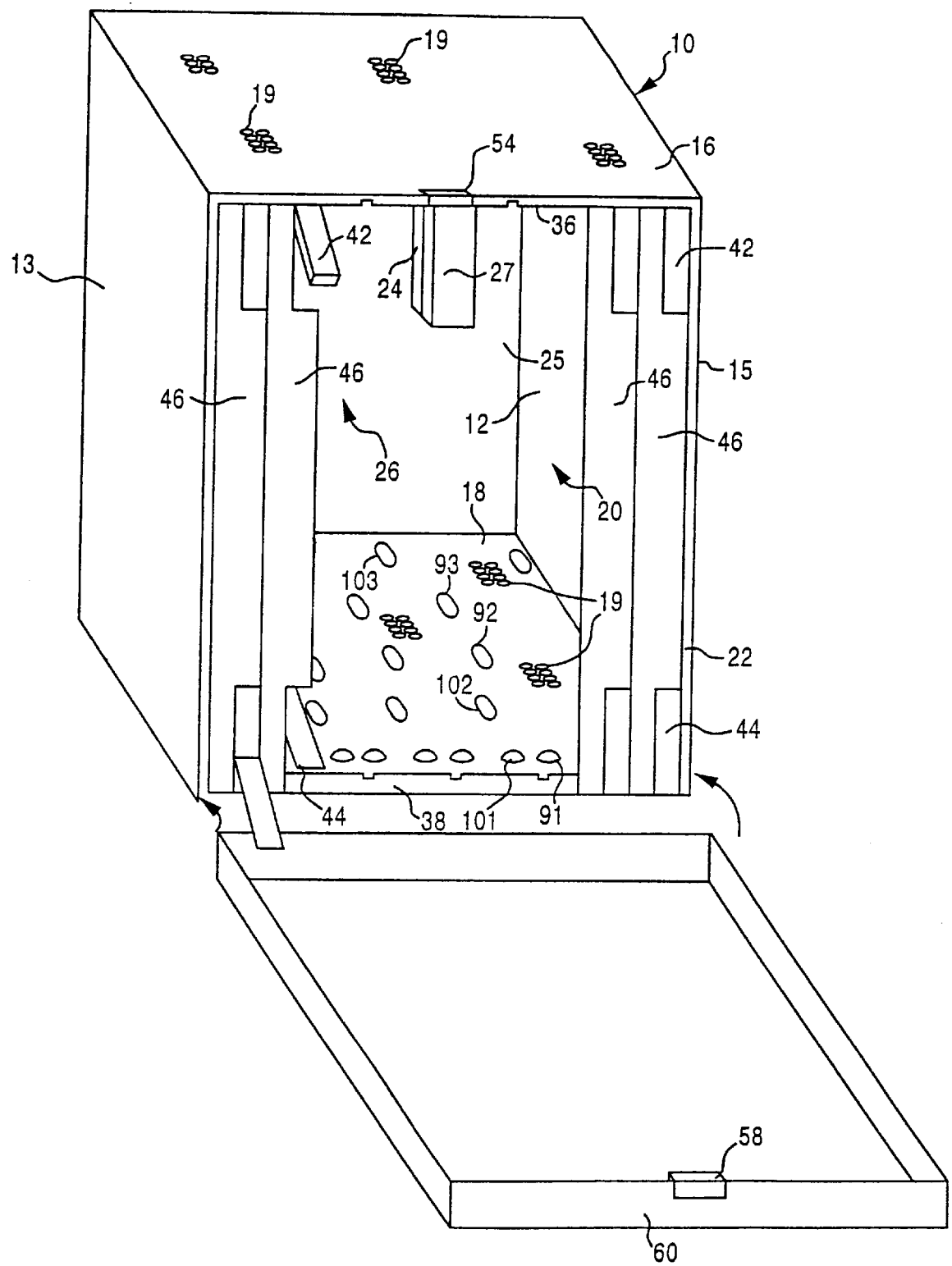
FIG. 1 is a diagrammatic perspective view of a printed circuit card housing architecture of the present invention.
Figure 2:
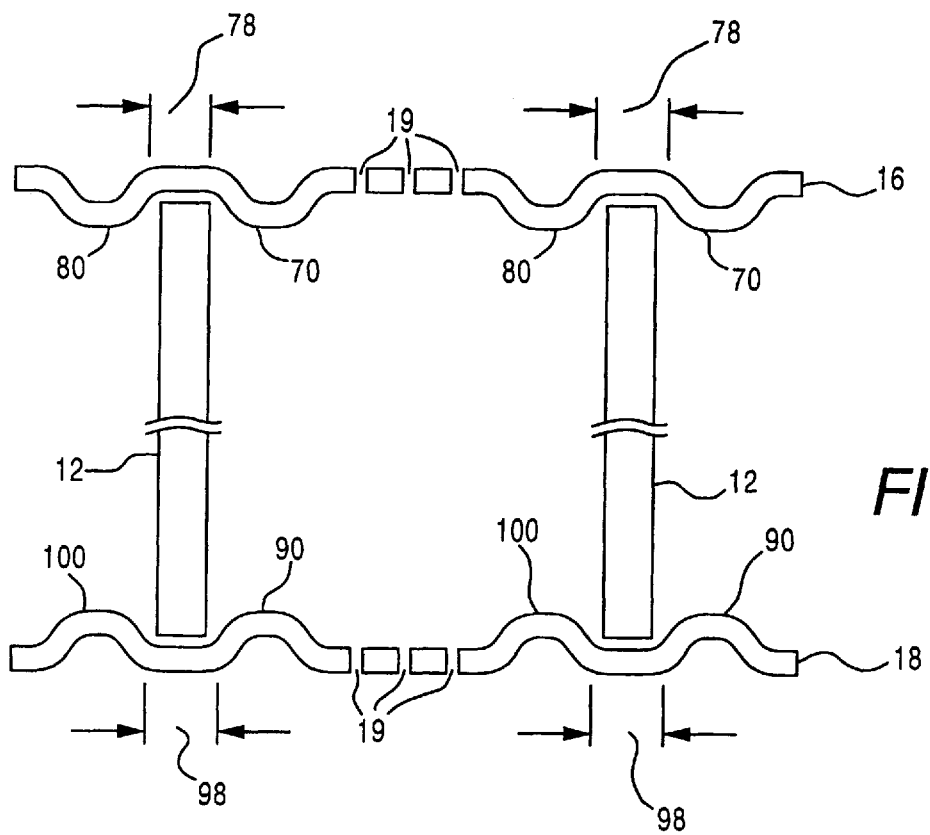
FIG. 2 is a diagrammatic end view of a respective card slot of a printed circuit housing architecture according to the present invention.
Figure 3:
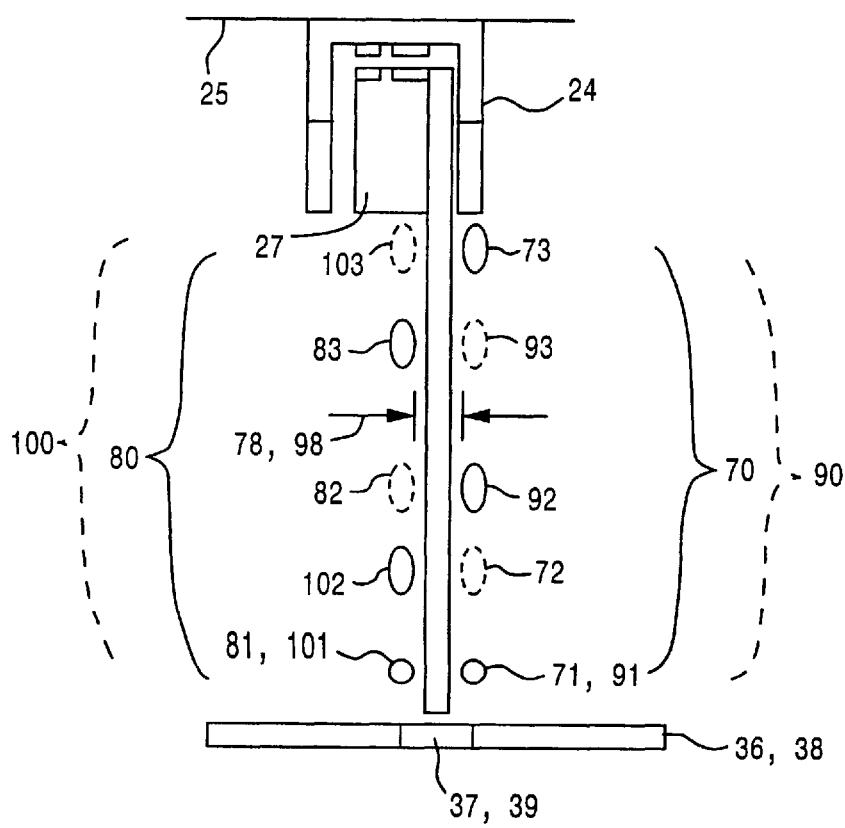
FIG. 3 is a diagrammatic plan view of a respective card slot of a printed circuit housing architecture according to the present invention.

Attention is directed to FIGS. 1–3, the printed circuit board housing architecture of the present invention is shown diagrammatically as comprising a generally rectangularly configured, 'card cage' housing 10, that is sized to accommodate insertion, storage and cooling of a plurality of printed circuit boards or cards 12. While the housing architecture of FIG. 1 is shown as being configured for a strand or pole-mounted application, it may also be configured for other applications, such as, but not limited to, a rack mounted application.

The housing 10 is preferably formed of a pair of first and second spaced apart vertically arranged electrically and thermally conductive (e.g., metallic) side panels 13 and 15, and upper and lower guide perforated electrically and thermally conductive (metallic) panels or plates 16 and 18. By perforated is meant that each of the upper and lower sheet metal plates 16 and 18 contains a gridwork or matrix of air flow perforations. 19, that are distributed among parallel arranged patterns of card insertion slot-defining bumps or upsets, to be described. The number and size of the air flow perforations 19 are such as allow cooling air flow into a card-receiving storage volume 20 for cooling the printed circuit boards 12, yet not so large as to permit EMI leakage therethrough.

The upper and lower guide perforated sheet metal plates 16 and 18 are joined to flanges of the side panels 13 and 15 by means of suitable fasteners (such as rivets and the like), so as to define the generally rectangular printed circuit card storage volume or cage 20 therebetween. Once a printed circuit card has been inserted through a front end 22 of the housing 10, a connector 27 at the rear edge of the card is mechanically and electrically interfaced with or mated to a respective one of a plurality of card slot backplane connectors 24, that are installed at a rear region 26 of the card-receiving storage volume 20. The backplane connectors 24 may be mounted to a backplane panel 25 that is affixed to flanges at rear edges of the two horizontal upper and lower sheet metal plates 16 and 18.

Adjacent to the front end 22 of the card cage housing, the upper and lower plates 16 and 18 have respective upper and lower troughs, front ends of which form generally horizontal flanges or rails 36 and 38. These rails 36 and 38 are engaged by respective latches 42 and 44, that are pivotally attached to upper and lower portions of the printed circuit boards 12, terminating the front edges of the printed circuit boards. The latches 42 and 44 are used to leverage the printed circuit boards 12 into and out of the backplane connectors 24 at the backplane 25. A fiber tray for cable routing (not shown) may be attached to the bottom of the lower trough of the lower plate 18. In addition, a lock bracket 54 may be attached to the top of the upper trough of upper plate 16, to provide a lock detent that engages a latch 58 on a front closure or door 60. A set of tabs may be formed on the side edges of the upper and lower plates 16 and 18, to provide vertical locational registration for the side plates 12 and 14 and the backplane panel 25.

As described previously, rather than attaching a separate set of card guide modules to each of the upper and lower plates 16 and 18, for the purpose of supporting and guiding each printed circuit 12 board into its associated backplane connector, the present invention integrates a card guide structure directly into the material of the upper and lower sheet metal plates 16 and 18, proper. Specifically, the surface contour of the upper and lower sheet metal plates 16 and 18 is shaped to form distributions of staggered arrangements of mutually opposed bumps or 'upsets'. These upsets serve to guide the printed circuit boards 12 in a vertical on-edge orientation to facilitate engagement of card connectors 27 at the rear edges of the printed circuit boards 12 with the card slot backplane connectors 24.

As pointed out above, the upsets do not penetrate the sheet metal plates, but simply deform its surface, so that there are no EMI leaks through the bumps, thus eliminating the need for and assembly of additional perforated plates. As shown in the solid and broken lined bump patterns of the plan view of FIG. 3, the upper and lower sheet metal plates 16 and 18 are arranged such that first and second staggered arrangements 70 and 80 of downwardly projecting upsets of the upper plate 16 are mutually aligned with and are interleaved with first and second staggered arrangements 90 and 100 of upwardly projecting upsets of the lower plate 18, so as to allow a respective printed circuit card to be inserted between.

More particularly, as shown in detail in the end view of FIG. 2 and the plan view of FIG. 3, for a respective card slot, at multiple spaced apart locations, the material of the upper sheet metal plate 16 is selectively downwardly indented, as by means of a computer controlled punch tool. The indenting of the sheet metal plate is such that its interior surface contains a first staggered arrangement 70 of downwardly projecting bumps or upsets, three of which are shown at 71–73, and a second staggered arrangement 80 of downwardly projecting bumps, three of which are shown at 81–83, spaced apart from the bump pattern 70 by a spacing 78 therebetween. Each upset or bump has gentle rounded edges to allow for tolerance variations and prevent a printed circuit board from snagging in the bump formed card slot.

As shown in the plan view of FIG. 3, each of bump patterns 70 and 80 has a generally circular or hemispherically shaped bump 71, 81 at a forward end thereof adjacent to a notch or groove 37 in the upper rail 36. The notch 37 is sized to be slightly wider than the thickness of the printed circuit board 12, and serves as an initial upper edge guide or insertion point for a respective printed circuit board being installed into the card cage. The bump pattern 70 also has a series of generally oval or oblong shaped bumps, two of which are shown at 72 and 73, while bump pattern 80 has a similar series of generally oval or oblong shaped bumps, two of which are shown at 82 and 83. These additional elongated bumps of pattern 70 are offset from, rather than being directly aligned with, the elongated bumps of the bump pattern 80, which reduces the number of bumps required to guide and retain a printed circuit board in a respective channel slot.

In a similar manner, the lower sheet metal plate 18 is selectively upwardly indented such that its interior surface contains a first staggered arrangement 90 of upwardly projecting bumps or upsets 91–93 that are spaced apart from a second staggered arrangement 100 of upwardly projecting bumps or upsets 101–103, shown in broken lines in FIG. 3. As with the upper sheet metal plate 16, the intervening space or separation 98 between the bump arrangements 90 and 100 on the lower sheet metal plate 18 approximates the thickness of a printed circuit board 12, corresponding to a card slot insertion channel and is sized to permit a printed circuit board that has been placed on edge to pass between the bump arrangements 90 and 100.

As in the case of the upper plate 16, the upwardly projecting bump patterns 90 and 100 in the lower plate 18 have generally circular or hemispherically shaped bumps 91, 101 at a forward end thereof adjacent to a notch or groove 39 in the rail 38. Like groove 37 in the upper rail 36, the groove 39 is sized slightly wider than the thickness of the printed circuit board 12, and serves as an initial lower guide or insertion point for a respective board. Bump pattern 90 further includes a series of generally oval or oblong shaped bumps, two of which are shown at 92 and 93, while bump pattern 100 has a similar series of generally oval or oblong shaped bumps, two of which are shown at 102 and 103, and the additional elongated bumps of pattern 90 are offset from rather than being directly aligned with the elongated bumps of pattern 100.

As pointed out above, the space 78 between the upper plate bump arrangements 70 and 80 and the space 98 between the lower plate bump arrangements 90 and 100 define a card slot insertion channel or slot that is sized to permit a opposite edges of printed circuit board 12 to pass between and be guided by the two pairs of bump arrangements toward the card slot's backplane connector. The bump patterns are such that, from its initial point of insertion into the notches 37 and 39, as a printed circuit board 12 encounters each subsequent upset along the respective patterns, deviation from a straight travel path toward the backplane connector 24 is reduced. As a non-limiting example, the bump patterns may be such that from an initial insertion angle (e.g. on the order of approximately five degrees) the travel direction of a printed circuit board may be reduced to a relatively small value (e.g., on the order of less than one degree) before a connector at the rear of the printed circuit board card is brought into engagement with a mating connector 24 at the backplane 25.

When a printed circuit board is to be installed in a respective card slot, the respective notches 37 and 39 in the front flanges 36 and 38 of the upper and lower plates provide initial locational registration. Then, as the printed circuit board is inserted through the notches 37 and 39 and is advanced into the card cage 20, it encounters the front edge pairs of round upsets 71/81, 91/101 that cause the printed circuit board 12 to be guided into a limited path of the card slot. Further insertion into the card cage causes the printed circuit board to encounter a second set of staggered oblong upsets 72/82, 92/102, which impart additional constraint of the travel path of the card. As the printed circuit board continues to travel into the card cage 20, it encounters a third set of staggered oblong upsets 73/83, 93/103, which confine movement of the card so that it is brought into engagement with a backplane connector 24.

As described above, each of the upper sheet metal plate 16 and the lower sheet metal plate 18 may be readily selectively indented by means of a numerically controlled, computer driven punch tool, so that their interior surfaces contain staggered arrangements projecting card guide/slot bumps or upsets. By building a punch and die set that includes a set of round and staggered oblong upsets, upper and lower sheet metal plates having bump patterns of varying pitches can be constructed for different size card cages, such as those configured for pole mount, strand mount, and rack mount applications.

As will be appreciated from the foregoing description, by shaping respective upper and lower perforated sheet metal plates to include a plurality of mutually opposed staggered patterns of bumps, the present invention is able to form guide channels for guiding printed circuit boards into engagement with respective card slot backplane connectors, without the need for a separate set of card guides. EMI leakage is avoided by sizing the perforations to be sufficiently small, and the upsets themselves do not penetrate the sheet metal plates.

While I have shown and described an embodiment in accordance with the present invention, it is to be understood that the same is not limited thereto but is susceptible to numerous changes and modifications as are known to a person skilled in the art, and I therefore do not wish to be limited to the details shown and described herein, but intend to cover all such changes and modifications as are obvious to one of ordinary skill in the art.

What is claimed:

1. A housing architecture for receiving and supporting a plurality of printed circuit cards in associated card slots therefor comprising:
   first and second spaced apart side panels;
   first and second guide panels coupled to said side panels so as to form a printed circuit card-receiving storage volume therebetween; and
   a plurality of card slot connectors adjoining said card-receiving storage volume, and arranged to be electrically coupled with electrical conductors of printed circuit cards; and wherein
   each of said first and second guide panels contains
      a plurality of apertures that permit the passage of cooling fluid therethrough to said printed circuit card-receiving storage volume, while having a size sufficiently small as to substantially reduce electromagnetic interference emission leakage therethrough, and
      for each of said associated card slots, first and second staggered arrangements of bumps projecting outwardly from the surface of a respective guide panel, without any portion of said respective guide panel being physically severed for the formation a respective bump, so that no opening is created through surface material of said respective guide panel by said respective bump projecting outwardly therefrom, so that there are no electromagnetic interference emission leaks through said guide panel as a result of said bumps projecting outwardly from said guide panel, said first and second arrangements of bumps being spaced apart from one another by a distance sufficient to form a channel insertion channel that is adapted to receive an edge of a respectively insertable printed circuit card, and thereby adapted to guide said respectively insertable printed circuit card into engagement with a respective one of said connectors adjoining said printed circuit card-receiving storage volume.

2. A housing architecture according to claim 1, further including an arrangement of card edge insertion slots located adjacent to said staggered arrangements of bumps of said card slots, a respective card edge insertion slot being configured to guide a respectively insertable printed circuit card into a respective channel formed between said first and second staggered arrangements of bumps.

3. A housing architecture according to claim 1, wherein said first staggered arrangement of bumps has a bump pattern that differs from that of said second staggered arrangement of bumps.

4. A housing architecture according to claim 1, wherein separations between bumps of said first staggered arrangement of bumps differ from separations between bumps of said second staggered arrangement of bumps.

5. A housing architecture according to claim 1, wherein bumps of said first and second staggered arrangements of bumps include bumps that are generally oblong in the direction of said card insertion channel.

6. A housing architecture according to claim 2, wherein said first and second staggered arrangements of bumps include generally hemispherically shaped bumps located adjacent to said card edge insertion slots.

7. A housing architecture for receiving and supporting a plurality of printed circuit cards comprising:
   first and second spaced apart side panels coupled with upper and lower card guide panels to define a printed circuit card storage volume therebetween; and
   a plurality of backplane connectors adjoining said card storage volume, and arranged to be electrically coupled with electrical conductors of printed circuit cards; and wherein
   each of said upper and lower guide panels contains a plurality of apertures that permit the passage of cooling fluid therethrough to said printed circuit card storage volume, while having a size sufficiently small as to substantially reduce electromagnetic interference emission leakage therethrough, and a plurality of first and second staggered arrangements of bumps in the surface contour of said each of said upper and lower guide panels, a respective bump projecting outwardly from the surface of a respective guide panel, without having any portion of said respective guide panel being physically severed for the formation of said respective bump, so that no opening is created through surface material of said respective guide panel by said respective bump projecting outwardly therefrom, so that there are no electromagnetic interference emission leaks through said upper and lower guide panels as a result of said bumps projecting outwardly from said upper and lower guide panels, said first and second arrangements of bumps being spaced apart from one another by a distance sufficient to form a guide channel of a respective printed circuit card slot that is adapted to receive an edge of a respectively insertable printed circuit card, and thereby adapted to guide said respectively insertable printed circuit card into engagement with a respective one of said backplane connectors adjoining said card storage volume.

8. A housing architecture according to claim 7, further including an arrangement of card edge insertion slots located adjacent to said plurality of first and second staggered arrangements of bumps of said card slots, a respective card edge insertion slot being configured to guide a respectively insertable printed circuit card into a respective guide channel formed between said first and second staggered arrangements of bumps.

9. A housing architecture according to claim 7, wherein said first staggered arrangement of bumps has a bump pattern that differs from that of said second staggered arrangement of bumps.

10. A housing architecture according to claim 7, wherein separations between bumps of said first staggered arrangement of bumps differ from separations between bumps of said second staggered arrangement of bumps.

11. A housing architecture according to claim 7, wherein bumps of said first and second staggered arrangements of bumps include bumps that are generally oblong in the direction of said channel.

12. A housing architecture according to claim 8, wherein said first and second staggered arrangements of bumps include generally hemispherically shaped bumps located adjacent to said card edge insertion slots.

\* \* \* \* \*